United States Patent
De Hoogh et al.

(10) Patent No.: US 11,681,233 B2
(45) Date of Patent: Jun. 20, 2023

(54) GAS MIXING FOR FAST TEMPERATURE CONTROL OF A COOLING HOOD

(71) Applicant: ASML NETHERLANDS B.V., Veldhoven (NL)

(72) Inventors: Joost De Hoogh, Eindhoven (NL); Alain Louis Claude Leroux, Eindhoven (NL); Alexander Marinus Arnoldus Huijberts, Veghel (NL); Christiaan Louis Valentin, Eindhoven (NL); Robert Coenraad Wit, Eindhoven (NL); Dries Vaast Paul Hemschoote, Vosselaar (BE); Frits Van Der Meulen, Eindhoven (NL); Johannes Franciscus Martinus Van Santvoort, Eindhoven (NL); Radu Donose, Eindhoven (NL)

(73) Assignee: ASML NETHERLANDS B.V., Veldhoven (NL)

(*) Notice: Subject to any disclaimer, the term of this patent is extended or adjusted under 35 U.S.C. 154(b) by 0 days.

(21) Appl. No.: 17/282,029

(22) PCT Filed: Sep. 26, 2019

(86) PCT No.: PCT/EP2019/076001
§ 371 (c)(1),
(2) Date: Apr. 1, 2021

(87) PCT Pub. No.: WO2020/069960
PCT Pub. Date: Apr. 9, 2020

(65) Prior Publication Data
US 2021/0356875 A1 Nov. 18, 2021

(30) Foreign Application Priority Data

Oct. 5, 2018 (EP) .................................. 18198758
Sep. 12, 2019 (EP) .................................. 19197024

(51) Int. Cl.
G03F 7/20 (2006.01)
G03F 7/00 (2006.01)
F25D 3/10 (2006.01)

(52) U.S. Cl.
CPC ........... *G03F 7/70875* (2013.01); *F25D 3/10* (2013.01)

(58) Field of Classification Search
CPC ............................. G03F 7/70875; F25D 3/10
(Continued)

(56) References Cited

U.S. PATENT DOCUMENTS 7,476,491 B2 * 1/2009 Van Der Net ...... G03F 7/70925
430/311
8,906,585 B2 * 12/2014 Yoshimochi ........ G03F 7/70341
430/311
(Continued)

FOREIGN PATENT DOCUMENTS

EP 1041605 10/2000
EP 1672680 6/2006
(Continued)

OTHER PUBLICATIONS

International Search Report and Written Opinion issued in corresponding PCT Patent Application No. PCT/EP2019/076001, dated Jan. 7, 2020.

*Primary Examiner* — Hung V Nguyen
(74) *Attorney, Agent, or Firm* — Pillsbury Winthrop Shaw Pittman, LLP (57) ABSTRACT

A system having a sub-system that is configured to change a thermal condition of a physical component from a set-point to a new set-point, wherein the sub-system includes: a mixer operative to receive a first conditioning fluid having a first temperature and a second conditioning fluid having a second temperature different from the first temperature, and operative to supply to the physical component a mix of the
(Continued)

first conditioning fluid and the second conditioning fluid; and a controller configured to control the mixer in dependence on the new set-point. Also a method of operating a lithographic apparatus as well as a device manufactured using the system described herein or according to methods described herein.

20 Claims, 2 Drawing Sheets

(58) Field of Classification Search
USPC .................................................. 355/72–76
See application file for complete search history.

(56) References Cited

U.S. PATENT DOCUMENTS

| | | |
|---|---|---|
| 2006/0291060 A1 | 12/2006 | Shirai et al. |
| 2010/0033694 A1 | 2/2010 | Kamiya et al. |
| 2011/0135839 A1 | 6/2011 | Dziomkina |
| 2018/0166300 A1* | 6/2018 | Zagorz ................. B01F 35/833 |
| 2020/0158605 A1* | 5/2020 | Tarafder ................ G01N 21/01 |

FOREIGN PATENT DOCUMENTS

| | | |
|---|---|---|
| EP | 2494290 | 9/2012 |
| JP | 2000281971 | 10/2000 |
| JP | 2001244179 | 9/2001 |
| WO | 2011059612 | 5/2011 |
| WO | 2015018424 | 2/2015 |
| WO | 2018041491 | 3/2018 |
| WO | 2018041599 | 3/2018 |

\* cited by examiner

GAS MIXING FOR FAST TEMPERATURE CONTROL OF A COOLING HOOD

CROSS-REFERENCE TO RELATED APPLICATIONS

This application is the U.S. national phase entry of PCT Patent Application No. PCT/EP2019/076001, which was filed Sep. 26, 2019, which claims the benefit of priority of European Patent Application No. 18198758.7, which was filed on 5 Oct. 5, 2018, and of European Patent Application No. 19197024.3, which was filed on Sep. 12, 2019. Both European applications are incorporated herein in their entireties its entirety by reference.

FIELD

The present invention relates to a system suitable for use in a lithographic apparatus and to a method suitable for use with a lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

A radiation beam used to project a pattern onto a substrate will deliver a substantial amount of heat to that substrate, and will cause localized heating of the substrate. Localized expansion of the substrate caused by the heating will reduce the accuracy with which a projected pattern overlies patterns already present on the substrate.

WO2018/041599, the contents of which are incorporated by reference in their entirety, describes a cooling apparatus suitable for use with a lithographic apparatus comprising a cooling element located above a substrate and adjacent an exposure area wherein the cooling element is configured to remove heat from a substrate held on the substrate table. A gas may be supplied between the cooling element and the substrate to transport the heat from the substrate to the cooling element. The combination of the pressure of the gas and the separation between the cooling element and the substrate may be such that the accommodation coefficient of the substrate does not have a significant effect upon transfer of the heat from the substrate to the cooling element. As known, the accommodation coefficient is a quantity which is used to express the efficiency of energy transfer between a gas and a boundary, e.g., the substrate. The cooling apparatus itself may be thermally conditioned so as to keep the cooling element at a desired temperature. For example, the cooling apparatus may include a heat removal system configured to remove heat from the cooling element. An implementation of the heat removal system may include a fluid cooling system. The fluid cooling system may comprise a cooler to cool a conditioning fluid, e.g., a gas, the cooler being located remotely from the cooling element. The fluid cooling system may also include an inlet conduit configured to deliver the cooled conditioning fluid to the cooling element in order to cool the cooling element, and an outlet conduit configured to remove the conditioning fluid from the cooling element after the conditioning fluid has absorbed the heat from the cooling element. The subject matter of WO2018/041599 may be combined with that of any aspect of the present invention, except where the features are technically incompatible, and all such combinations are explicitly disclosed and covered herein.

SUMMARY

The amount of energy delivered to a substrate, and therefore the cooling power required to maintain a suitable temperature, may vary. For example, in an EUV lithography apparatus, the imaging of different layers on a silicon wafer may require the use of different power settings. Similarly, different types of resist may also require different powers to be used. There is a delay in switching the cooling power of a cooling element and this may negatively impact on the throughput of a lithographic apparatus as it takes time for the desired temperature, and therefore cooling power, to be achieved. Alternatively or additionally, the delay in switching the cooling power may result in the substrate being at an undesired temperature, which may reduce the accuracy with which patterns are projected onto the substrate.

Whilst it may be possible to alter the cooling power by moving the cooling element closer to the substrate, there is a danger that the element may touch a wafer being imaged, which may cause damage to the wafer. In addition, if the cooling element is moved too far away from the substrate, this may result in radiation being blocked, which could reduce throughput or introduce inaccuracies into the patterned radiation beam.

Altering the pressure of the gas between the cooling element and the substrate could be used to change the cooling power of the system. However, the pressure within the lithographic apparatus needs to be within certain limits, so there is only a limited range of pressures which could be used and this range may not be sufficient to provide the necessary variance in cooling power required.

In addition, whilst during operation of a lithographic apparatus there is a need to provide cooling, in certain circumstances, it may be necessary to have one or more components of a lithographic apparatus at a stable temperature which is substantially equal to or slightly above room temperature, such as, for example, 22° C. This may be for calibration purposes. Existing systems may only provide cooling and therefore be unable to provide a stable temperature above 0° C., such as room temperature.

Further, whilst it may be possible to alter the temperature of a conditioning fluid by increasing or decreasing the power of a cooler used to cool or heat the conditioning fluid, the change in temperature of the conditioning fluid at the place of interest can be delayed as a result of the cooler being located remotely from the cooling apparatus. This may result in a loss of throughput of the lithographic apparatus as a whole (the number of substrates processed per hour) whilst the temperature of the conditioning fluid is being altered.

It is desirable to provide a system which addresses the problem identified or some other problem associated with the prior art.

Whilst the present application generally refers to EUV lithographic apparatus, it will be appreciated that the system and methods described herein are also applicable to other types of lithographic apparatus.

The present invention has been made in consideration of the problems identified above.

According to a first aspect of the present invention, there is provided a system comprising a sub-system that is configured to change a thermal condition of a physical component from a set-point to a new set-point, wherein the sub-system comprises: a mixer operative to receive a first conditioning fluid having a first temperature and a second conditioning fluid having a second temperature different from the first temperature, and operative to supply to the physical component a mix of the first conditioning fluid and the second conditioning fluid: and a controller configured to control the mixer in dependence on the new set-point.

The mixing, as closely as possible to the place of interest, e.g., the cooling element, of a first conditioning fluid and a second conditioning fluid which are at different temperatures allows for rapid and precise control of the temperature of the resultant mixture at the place of interest and also allows for the provision of a conditioning fluid having a stable temperature. Since the temperature of the mixed conditioning fluid can be varied by adjusting the ratio of the first and second conditioning fluids, it is not necessary to wait for the temperature of the mixed fluid to alter its temperature through active heating or active cooling via a heat exchanger. Thus, the sub-system according to the present invention provides for faster switching of the power of the sub-system than in systems in which the cooling (or heating) power is adjusted by adjusting the power of the cooler (or heater) used to control the temperature of the conditioning fluid. In a lithographic apparatus, even seemingly very small fluctuations in the temperature of the substrate can result in errors which reduce the accuracy with which patterns are projected onto the substrate. In particular, heating of the substrate outside of the intended range may lead to slippage of the substrate with respect to the burls of a substrate table. The substrate may also change shape owing to thermally induced deformation such that it less closely conforms to the model of the substrate on which the operation of the lithographic apparatus is based, thereby resulting in reduced accuracy The mixer may be any mixer which is able to receive and mix fluids at very low temperatures, such as, for example, temperatures as low as $-100°$ C. or lower. In other embodiment, the mixer is able to receive and mix fluids at temperature in a range from $-200°$ C. to $100°$ C. In a further embodiment, the mix, i.e., the delivered mix from the mixer, comprises a temperature from $-100°$ C. to $50°$ C.

The controller is able to control the mixer to vary the amounts of the first conditioning fluid and the second conditioning fluid that are combined in order to provide a mixed conditioning fluid at the desired temperature. Any suitable controller may be used. The controller may be configured to adjust the mix of the first conditioning fluid and the second conditioning fluid in dependence on information from one or more sensors. The one or more sensors may comprise temperature-sensing sensors, for example thermometers or thermocouples, which monitor the temperature of the first and second conditioning fluids or the temperature of the mix. The one or more temperature sensors may comprise a resistance thermometer. The one or more temperature sensors may be Platinum Resistance (PT) thermometers, such as PT100 sensors or PT1000 sensors. The controller may receive an output from the one or more sensors and, in dependence on the temperature of the first and second conditioning fluids and on the desired temperature of the mix of the first and second conditioning fluids, the controller may control the mixer to change the ratio of the first conditioning fluid to the second conditioning fluid in the mix of the first and second conditioning fluids. The controller is thus able to provide a mixed conditioning fluid at a temperature between the temperature of the first conditioning fluid and the temperature of the second conditioning fluid. It is also possible to do this without waiting for either one of the individual first or second conditioning fluids to alter in temperature. In addition, it is possible to locate the mixer closer to the physical component to be thermally conditioned, which may be a cooling element or hood, than is possible where the temperature of the conditioning fluid is altered by adjusting the power of the apparatus used to heat or cool the conditioning fluid.

The system may be a lithography apparatus, preferably an EUV lithography apparatus.

The sub-system may include a cooling apparatus for cooling a physical component, for example a cooling element or hood of a lithography apparatus as disclosed in WO2018/041599 discussed above. In certain embodiments, the sub-system may alternatively or additionally include a heating apparatus for heating a physical component, for example a cooling element or hood of a lithographic apparatus. It will be appreciated that the term cooling element or hood is used since, during use, its predominant purpose will be to provide cooling, i.e., extracting heat. Even so, this does not preclude the cooling element or hood from being used to provide heating, i.e., supplying heat.

The physical component may be a substrate, substrate support or substrate table, or any other component of a lithography apparatus.

The set-points may be temperatures. In cases where greater cooling power is required, the new set-point may be a lower temperature than the temperature of the initial set point. Conversely, where less cooling power is required, the new set-point may represent a higher temperature than the temperature of the initial set point.

The first and second conditioning fluids may be the same or may be different from one another. In one aspect, the first and second conditioning fluids comprise nitrogen. It will be appreciated that other materials which are fluids at temperatures of $-100°$ C., such as, for example, hydrogen or helium, may be used. Nitrogen is a preferred conditioning fluid due to its ready availability, low cost, and general safety. Alternatively, mixtures of different fluids may be used as the conditioning fluid.

Nitrogen gas supplied in a clean-room environment generally has a temperature stability specification of $\pm 5$ K with respect to the ambient temperature of the clean-room. The clean-room itself has a temperature stability specification of around $20°$ C. to around $24°$ C. Consequently, the temperature of the nitrogen gas in its unconditioned form may lie within the range of around $15°$ C. to around $29°$ C. As such, the temperature of the nitrogen is not particularly well controlled.

The apparatus of the present application is able to overcome this issue by mixing a first conditioning fluid, which may be unconditioned, and a second conditioning fluid, which may be conditioned. By conditioned, it is meant that the temperature of the conditioning fluid has been adjusted, whether by heating or cooling, to a pre-selected level. By unconditioned, it is meant that the temperature of the conditioning fluid has not been adjusted and is subject to fluctuations in its temperature.

The cooling element or hood may comprise a body, an open cavity being provided in a lowermost face of the body, and further comprises a gas delivery conduit configured to deliver gas to the cavity. The gas conduit allows controlling the pressure within the cavity of the cooling element.

The cavity may be configured to form, together with an upper surface of the substrate, a volume which receives gas delivered by the gas delivery conduit. The cavity may have a roof which is less than 1 mm from the upper surface of the substrate in use.

The body may further contain a chamber connected to gas delivery conduit, a floor of the chamber being provided with openings. In other embodiment, the cooling element may comprise an additional body with a chamber connected to gas delivery conduit, a floor of the chamber being provided with openings.

The openings in the floor of the chamber may comprise a row of holes or an array of holes.

The cooling element may comprise additional chambers provided either side of the chamber, the additional chambers being connected to a different gas delivery conduit or conduits.

The body of the cooling element may have a thickness of 3 mm or less.

The cooling element may comprise gas supply configured to deliver gas at a pressure of 200 Pascals or more. The gas supply may be configured to deliver gas at a pressure of 100 kPa or more. The gas supply may be configured to deliver gas at a pressure of around 500 kPa or more. Although any pressure may be suitable for heat removal, by increasing the gas pressure the gas density will be increased accordingly and at higher gas density the heat can be removed more efficiently.

The cooling element may comprise conveying means configured to set a separation between the cooling element and the substrate. In one embodiment, the cooling element may be configured to have a separation of 20 microns or more from the substrate during use.

The cooling element may be configured to have a separation of 200 microns or less from the substrate during use.

The cooling element may be configured to provide an outward flow of gas from underneath the cooling element that acts as a cushion which prevents or inhibits contact occurring between the cooling element and the substrate.

The cooling element may be provided on a support which includes a retraction mechanism which is configured to pull the cooling element away from the substrate if unexpected movements are detected.

The cooling element may comprise an array of nozzles arranged to direct droplets of liquid onto the substrate.

The cooling element may be configured to have a separation of 50 microns or more from the substrate during use.

The cooling element may be configured to have a separation of 1 millimeter or more.

In an embodiment, the gas is hydrogen at a pressure 1,000 Pascals, and the separation between the resist surface and the roof of the cavity is around 0.5 mm. In this embodiment, the heat transfer accommodation coefficient between the resist surface and the cavity roof may be around 300 W/m$^2$K.

In one embodiment, the sub-system comprises the cooling apparatus, a mixed conditioning fluid conduit configured to channel the mix of the first conditioning fluid and the second conditioning fluid from the mixer to the cooling element or hood, wherein the mixed conditioning fluid conduit is further embedded into the cooling apparatus. For example, the cooling apparatus may be the cooling element or hood of the above embodiments. In a further generalized embodiment, the sub-system comprises a mixed conditioning fluid conduit configured to channel the mix of the first conditioning fluid and the second conditioning fluid from the mixer to the physical component, wherein the mixed conditioning fluid conduit is embedded into the physical component.

The controller of the system according to the first aspect of the present invention may be operative to control the mixer so as to maintain a magnitude of a mass flow-rate of the mix towards the physical component independent of the set-point and of the new set-point. That is to say that the mass flow-rate of the mix is maintained at a substantially stable amount even where the temperature is altered. Keeping a stable mass-flow rate ensures that the thermal mass of conditioning fluid passing through the sub-system remains constant, which allows for precise control of the cooling power of the sub-system. A stable mass-flow rate also reduces the chance on flow-induced vibrations.

The sub-system may comprise a first mass-flow controller operative to control a first mass-flow of the first conditioning fluid to the mixer, and a second mass-flow controller operative to control a second mass-flow of the second conditioning fluid to the mixer; and the controller is operative to control the first mass-flow controller and the second mass-flow controller in dependence on the new set point.

In this way the first and second mass-flow controllers are operable to adjust the mass of the first and second conditioning fluids passing into the mixer and thereby control the temperature of the resulting mixed conditioning fluid whilst retaining a stable mass flow of conditioning fluid.

The sub-system may comprise at least one of: a controllable cooler to control a magnitude of the first temperature and a controllable heater configured to control a magnitude of the second temperature.

Although it is possible to control the amount of the first and second conditioning fluids mixed to achieve a temperature between the temperature of the first conditioning fluid and the temperature of the second conditioning fluid, in order to achieve the desired range of temperatures for the mixed conditioning fluid, the first and/or second conditioning fluid need to be heated or cooled. The first and/or second conditioning fluids need to be heated or cooled to below or above the desired temperature of the mixed conditioning fluid such that when the first and second conditioning fluids are mixed, the desired temperature can be achieved.

The system may comprise a lithographic apparatus that is configured to use electromagnetic radiation for imaging a pattern via projection optics onto a semiconductor substrate held on a substrate support; the physical component is accommodated in the lithographic apparatus and comprises a cooling hood between the projection optics and the substrate support; and the cooling hood is operative to extract from the semiconductor substrate heat generated by the radiation incident on the semiconductor substrate.

The mixer may be accommodated within the lithographic apparatus. In other embodiment, the mixer may be located within the exposure chamber of the lithography apparatus.

The lithographic apparatus may comprise: a first inlet for receipt of the first conditioning fluid; a first conduit configured to channel the first conditioning fluid from the first inlet to the mixer; a second inlet for receipt of the second conditioning fluid; and a second conduit configured to channel the second conditioning fluid from the second inlet to the mixer.

The first and/or second conduits may be vacuum insulated. As known, a vacuum insulated conduit is accommodated in a gas-tight enclosure from which air or any other gas has been evacuated. Vacuum insulation limits the amount by which the conditioning fluids vary in temperature along their flow paths as heat loss through conduction and through convection is minimized as much as possible.

The sub-system may comprise at least one of: a controllable cooler configured to control a magnitude of the first temperature and accommodated external to the lithographic apparatus; and a controllable heater configured to control a magnitude of the second temperature and accommodated external to the lithographic apparatus.

The controllable cooler and the controllable heater are preferably accommodated external to the lithographic apparatus in order to allow easier access to the cooler or heater for maintenance. In addition, locating the cooler or heater within the lithographic apparatus could cause thermal interference with one or more other components of the lithographic apparatus.

The sub-system may comprise a mixed conditioning fluid conduit configured to channel the mix of the first conditioning fluid and the second conditioning fluid from the mixer to the physical component, the mixer and the mixed conditioning fluid conduit being configured to provide the mix to the physical component to control the thermal condition of the physical component within a predetermined time period. In one embodiment, the mixed conditioning fluid conduit is embedded into the physical component.

It is desirable to minimise idling of a lithographic apparatus and so it is desirable to be able to change the cooling power of a physical component, such as a cooling hood or element, as quickly as possible. In a lithographic apparatus, the cooling power will depend on the power of the radiation being used, with a greater cooling power required for high power operation. The reticle of a lithography apparatus may be changed for each different wafer layer. As known, the reticle, or: mask, carries the pattern to be imaged by onto the semiconductor substrate. Different reticles generally produce different amounts or different spatial densities of radiation at the semiconductor substrate. It is therefore desirable for the cooling power of the physical component to be changed in less time than it takes for the reticles to get changed so that the physical component is at the desired temperature when exposure resumes.

As such, the predetermined time period is less than or equal to the time period required for altering the power of the system. In this way, the physical component is at the correct power when the system, which may be a lithographic apparatus, begins operating at the new power. Preferably, the volume of the mixed conditioning fluid conduit and the physical component, which may be a cooling hood or element, is less than or equal to the volume of the mixed conditioning fluid which is passed from the mixer towards the physical component within the predetermined time period. In this way, the mixed conditioning fluid conduit and the physical component are flushed with conditioning fluid at the necessary temperature to provide the desired cooling power in readiness for the change in power used. The predetermined time period may be the time required for a reticle change in a lithographic apparatus.

In an embodiment, the system is configured to change a thermal condition of a physical component from a set-point to a new set-point within the predetermined time period, preferably, thirty seconds or less. In other embodiment, the system is configured to change a thermal condition of a physical component from a set-point to a new set-point between consecutive wafers. In other embodiment, the predetermined time period is less than the time it takes for the reticles to get changed. Preferably, this may be achieved by accommodating the mixer within the exposure chamber of the lithography apparatus, i.e., the mixer is located inside the exposure chamber.

In one embodiment, the sub-system comprises a mixed conditioning fluid conduit configured to channel the mix of the first conditioning fluid and the second conditioning fluid from the mixer to the physical component, wherein the mixed conditioning fluid conduit is further embedded into the cooling apparatus.

According to a second aspect of the present invention, there is provided a method comprising projecting a patterned radiation beam to form an exposure area on a semiconductor substrate held on a substrate support within a lithographic apparatus, and using cooling apparatus to cool the semiconductor substrate, the cooling apparatus comprising a cooling element located above the substrate support and adjacent to the exposure area, the cooling element acting to remove heat from the semiconductor substrate, wherein the method further comprises: providing a first conditioning fluid having a first temperature and a second conditioning fluid having a second temperature to a mixer, controlling the mixer to control the ratio of the first conditioning fluid and the second conditioning fluid provided to the cooling apparatus.

By providing first and second conditioning fluids at different temperatures and by controlling the ratio of the first conditioning fluid to the second conditioning fluid, it is possible to rapidly and accurately provide a mixed conditioning fluid at a desired temperature. This is faster than systems in which the temperature of the conditioning fluid is changed by a heating or cooling apparatus since the ratio can be changed very rapidly.

The method may further comprise operating a first mass-flow controller to control a first mass-flow of the first conditioning fluid to the mixer, and operating a second mass-flow controller to control a second mass-flow of the second conditioning fluid to the mixer.

The first and second mass-flow controllers are preferably operated to maintain a substantially constant mass-flow from the mixer to the cooling element.

The mass-flow controllers can thus be used to alter the ratio of the first conditioning fluid to the second conditioning fluid and thereby control the temperature of the mixed conditioning fluid and can also maintain a constant mass-flow of conditioning fluid to the cooling element.

The temperature of at least one of the first and the second conditioning fluids may be altered by a controllable heater or a controllable cooler to control the temperature of the first and/or second conditioning fluids.

In order to be able to achieve the desired temperature of the mixed conditioning fluid, it is necessary for the temperature of one of the first and second conditioning fluids to be below the desired temperature of the mixed conditioning fluid and for the temperature of the other of the first and second conditioning fluid to be above the desired temperature of the mixed conditioning fluid.

The first and second conditioning fluids may be mixed within the lithographic apparatus. Mixing the first and second conditioning fluid within the lithographic apparatus minimises the distance which the mixed conditioning fluid needs to travel to the cooling element. This minimises the amount by which the temperature of the mixed conditioning fluid changes before reaching the cooling element and also minimises the time taken for the mixed conditioning fluid to reach the cooling element thereby changing the cooling power of the cooling element. In a particular embodiment, the method further comprises changing a thermal condition of the cooling apparatus from a set-point to a new set-point in less time than it takes for reticles to get changed, and/or between consecutive wafers and/or, in less or equal than thirty seconds by mixing the first and second conditioning fluids within the exposure chamber of the lithography apparatus.

According to a third aspect of the present invention, there is provided a device manufactured using a lithographic apparatus comprising the apparatus according to the first aspect of the present invention or according to a method according to the second aspect of the present invention.

The ability to more quickly and precisely control the power of the cooling hood or element means that the accuracy with which a device, such as a semiconductor wafer, can be imaged is improved.

The features disclosed in respect of any aspect of the present invention may be combined with those of any other feature of the present invention.

BRIEF DESCRIPTION OF THE DRAWINGS

Embodiments of the invention will now be described, by way of example only, with reference to the accompanying schematic drawings, in which.

DETAILED DESCRIPTION

Figure 1:
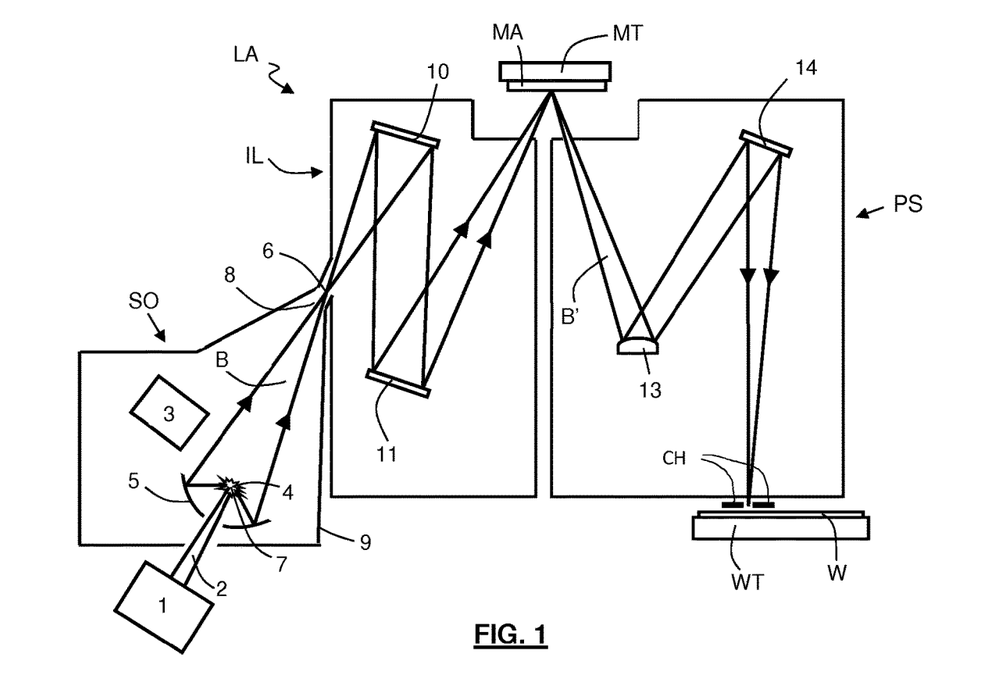
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13,14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL) or any other radiation source that is capable of generating EUV radiation.

In the diagram of FIG. 1, a cooling apparatus CH is depicted as accommodated between the projection system PS and the substrate W. For more detailed information on the cooling apparatus CH, please see WO2018/041599, discussed briefly above.

Figure 2:
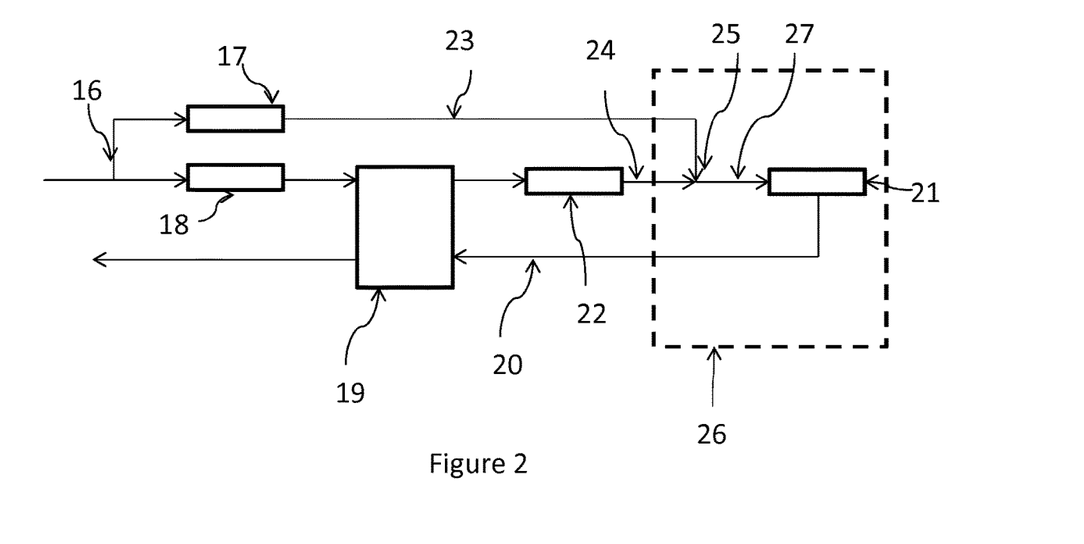
FIG. 2 is a schematic depiction of an embodiment of a sub-system in accordance with the present invention.

FIG. 2 depicts one embodiment of a sub-system according to the first aspect of the present invention. The sub-system comprises a conditioning fluid inlet conduit 16. The conditioning fluid conduit 16 is connected to a first mass flow controller 17 and a second mass flow controller 18. Although FIG. 2 depicts the conditioning fluid inlet conduit 16 being divided into two separate conduits, it will be appreciated that there may be two or more separate conditioning fluid inlet conduits. The second mass flow controller 18 is connected to a heat exchanger 19. The heat exchanger 19 is also connected to the return conduit 20 which returns conditioning fluid passing out of the cooling hood 21. The heat exchanger 19 is configured to transfer heat from the conditioning fluid from the second mass flow controller 18 to the conditioning fluid in the return conduit 20, thereby increasing the thermal efficiency of the sub-system. It will be appreciated that the heat exchanger 19 is an optional feature.

A cooling device 22, such as a cryogenic cooler, is connected to the heat exchanger 19. The cooling device 22 serves to cool the conditioning fluid from the second mass flow controller 18. A second conditioning fluid conduit 24 and a first conditioning fluid conduit 23 are provided and are arranged to join at a mixer 25. The second conditioning fluid conduit 24 and the first conditioning fluid conduit 23 may include vacuum insulated pipes. The mixer 25 is located within the lithographic apparatus shown schematically as box 26. A mixed conditioning fluid conduit 27 is in fluid connection with the mixer 25 as well as cooling hood 21. Return conduit 20 is in fluid connection with cooling hood 21 and is configured to convey conditioning fluid, leaving the cooling hood 21, via the heat exchanger 19 to exhaust or recycle.

In use, conditioning fluid, for example nitrogen, is provided in conditioning fluid conduit 16 where it is divided into two separate streams. One of the streams is provided to the first mass flow controller 17 and the other stream is provided to the second mass flow controller 18. The first and second mass flow controllers 17, 18 serve to adjust the mass of conditioning fluid flowing therethrough thereby adjusting the ratio of the first conditioning fluid to the second conditioning fluid in the ultimate mixed conditioning fluid. In embodiments comprising a heat exchanger 19, the conditioning fluid from the second mass flow controller 18 is passed into heat exchanger 19 where heat from the conditioning fluid is transferred to conditioning fluid in return conduit 20 in order to pre-cool the conditioning fluid before it is passed into cooling device 22. The cooling device 22 cools the conditioning fluid to a temperature lower than the desired temperature of the mixed conditioning fluid. In an example, the cooling device 22 cools the conditioning fluid down to around −100° C., but it will be appreciated that higher or lower temperatures are also contemplated.

Conditioning fluid in first conditioning fluid conduit 23 is unconditioned and, as such, the temperature of the conditioning fluid is subject to fluctuation between around 15° C. and 29° C. The first and second conditioning fluids are mixed in mixer 25 and the ratio of the first to the second conditioning fluids is adjusted in order to achieve a mixed conditioning fluid stream at a desired temperature. For example, if the first conditioning fluid is at 20° C. and the second conditioning fluid is at −100° C., if the desired temperature of the mixed cooling fluid is −40° C., the first and second conditioning fluids will be mixed in a 50/50 ratio. The temperature of the first conditioning fluid and the temperature of the second conditioning fluid are monitored and the ratio is adjusted in order to obtain a stable temperature of the mixed conditioning fluid. The mixed conditioning fluid is passed to the cooling hood 21 which is in thermal communication with a semiconductor substrate (not shown) and the cooling hood 21 cools the substrate. The mixed conditioning fluid passes through the cooling hood 21 during which passage the mixed conditioning fluid absorbs heat. The mixed conditioning fluid exits the cooling hood 21 and passes through return conduit 20. The return conduit 20 is in fluid connection with the heat exchanger 19 (if present) where it absorbs heat before passing to exhaust or recycle. This means, that the mixed conditioning fluid conduit 27, which carries the mixed conditioning fluid stream, may be embedded into the cooling apparatus and/or into the cooling hood 21.

Figure 3:
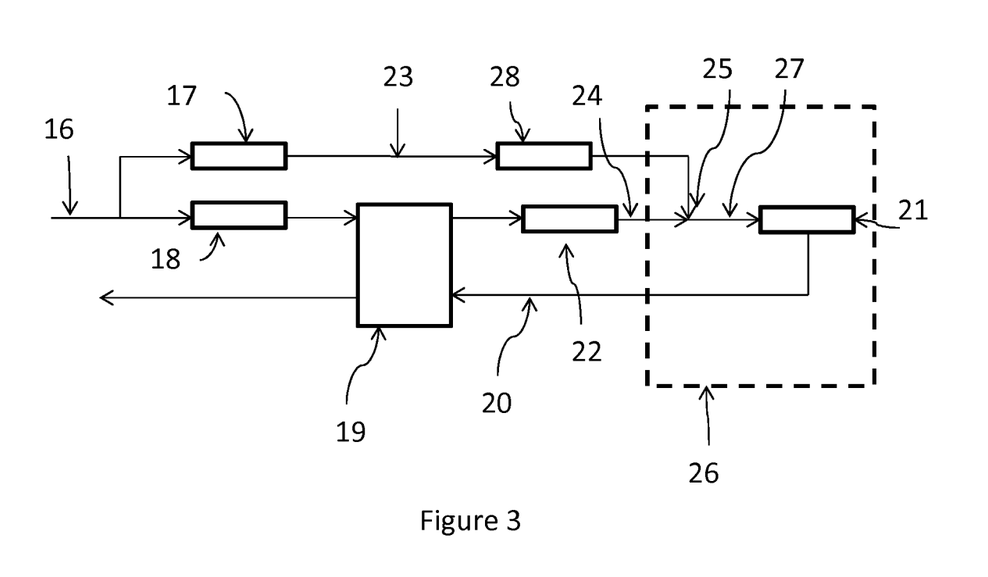
FIG. 3 is a schematic depiction of another embodiment of a sub-system in the invention.

FIG. 3 depicts another embodiment of the sub-system as an alternative to the sub-system of FIG. 2. The features of the alternative embodiment that are the same as those shown in the embodiment of FIG. 2 are indicated with same reference numerals. The sub-system of FIG. 3 includes as an additional feature a heating device 28 which is configured to heat the conditioning fluid from the first mass flow controller 17.

In use, the sub-system of FIG. 3 operates in much the same way as the apparatus of FIG. 2. In addition, the presence of heating device 28 allows for the conditioning fluid from the first mass controller 17 to be heated to a temperature higher than the ambient temperature that is in the range of 15° C. to 29° C. The cooling hood 21 may need to be held at a temperature which is around room temperature, for example around 22° C. Since the temperature of the conditioning fluid as supplied from an external supply source can vary between around 15° C. to 29° C., it may be the case that the conditioning fluid is not sufficiently warm to provide the desired temperature of mixed conditioning fluid. In order to allow the temperature of the mixed conditioning fluid to be adjusted accurately, the heating device 28 heats the first conditioning fluid to a temperature above the intended temperature of the mixed conditioning fluid, for example up to around 40° C. The heated first conditioning fluid can then be mixed with the second conditioning fluid in order to achieve the desired temperature. In this way, the cooling hood may be heated in a stable and controlled way up to around room temperature, for example 22° C., for the purposes of calibration. In addition heating the cooling hood can be used to remove any water or other volatile compounds from the cooling hood.

The diagrams of FIGS. 2 and 3 show the second mass flow controller 18 as located upstream of the heat exchanger 19 and upstream of the cooling device 22. The diagram of FIG. 3 shows the first mass controller 17 as located upstream of the heating device 28. Preferably, the heat exchanger 19 is accommodated in a separate high-vacuum environment to reduce the amount of heat transfer to heat-sensitive components of the lithographic apparatus LA. Preferably, the first mass flow controller 17 and the second mass controller 18 are located outside the high-vacuum environment and, possibly, outside the lithographic apparatus LA, such as to render them accessible for service actions. Functionally, however, the first mass controller 17 could be located downstream of the heating device 28, and the second mass flow controller 18 could be located downstream of the heat exchanger 19 or downstream of cooling device 22.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

In summary, the present invention allows for quick and precise switching of the temperature of a cooling hood in a lithography apparatus thereby minimising downtime of the apparatus and reducing potential overlay errors. It also allows a stable room temperature of the cooling hood regardless of the ambient temperature surrounding the lithographic apparatus or the temperature of the conditioning fluid.

Embodiments are provided according to the following clauses:

1. A system comprising a sub-system that is configured to change a thermal condition of a physical component from a set-point to a new set-point, wherein the sub-system comprises:
   a mixer operative to receive a first conditioning fluid having a first temperature and a second conditioning fluid having a second temperature different from the first temperature, and operative to supply to the physical component a mix of the first conditioning fluid and the second conditioning fluid; and
   a controller configured to control the mixer in dependence on the new set-point.
2. The system of clause 1, wherein the controller is operative to control the mixer so as to maintain a magnitude of a mass flow-rate of the mix towards the physical component independent of the set-point and of the new set-point.
3. The system of clause 2, wherein:
   the sub-system comprises:
      a first mass-flow controller operative to control a first mass-flow of the first conditioning fluid to the mixer; and
      a second mass-flow controller operative to control a second mass-flow of the second conditioning fluid to the mixer; and
   the controller is operative to control the first mass-flow controller and the second mass-flow controller in dependence on the new set-point.
4. The system of any of clauses 1 to 3, wherein the sub-system comprises at least one of: a controllable cooler configured to control a magnitude of the first temperature and a controllable heater configured to control a magnitude of the second temperature.
5. The system of any of clauses 1 to 4, wherein:
   the system comprises a lithographic apparatus that is configured to use electromagnetic radiation for imaging a pattern via projection optics onto a semiconductor substrate held on a substrate support;
   the physical component is accommodated in the lithographic apparatus and comprises a cooling hood between the projection optics and the substrate support, preferably, the physical component is a cooling apparatus configured to cool the substrate; and
   the cooling hood is operative to extract from the semiconductor substrate heat generated by the radiation incident on the semiconductor substrate.
6. The system of clause 5, wherein the mixer is accommodated within the lithographic apparatus.
7. The system of clause 6, wherein the mixer is located within the exposure chamber of the lithography apparatus.
8. The system according to any of clauses 5 to 7, wherein the lithographic apparatus comprises:
   a first inlet for receipt of the first conditioning fluid;
   a first conduit configured to channel the first conditioning fluid from the first inlet to the mixer;
   a second inlet for receipt of the second conditioning fluid; and
   a second conduit configured to channel the second conditioning fluid from the second inlet to the mixer.
9. The system according to any of clauses 5 to 8, wherein the sub-system comprises at least one of:
   a controllable cooler configured to control a magnitude of the first temperature and accommodated external to the lithographic apparatus; and
   a controllable heater configured to control a magnitude of the second temperature and accommodated external to the lithographic apparatus.
10. The system according to any of clauses 2 to 9, wherein the sub-system comprises a mixed conditioning fluid conduit configured to channel the mix of the first conditioning fluid and the second conditioning fluid from the mixer to the physical component, the mixer and the mixed conditioning fluid conduit being configured to provide the mix to the physical component to control the thermal condition of the physical component within a predetermined time period.
11. The system of clause 10, wherein the predetermined time period is less than or equal to the time period required for altering the power of the physical component.
12. The system according to clause 10 or clause 11, where the mixed conditioning fluid conduit is embedded into the physical component.
13. The system according to any of clauses 1 to 9, wherein the sub-system comprises a mixed conditioning fluid conduit configured to channel the mix of the first conditioning fluid and the second conditioning fluid from the mixer to the physical component, wherein the mixed conditioning fluid conduit is embedded into the physical component.
14. The system according to any of clauses 1 to 13, wherein the mixer is able to receive and mix fluids at a temperature of −100° C. or lower, or at a temperature from −200° C. to 100° C.
15. The system according to any of clauses 1 to 14, where the mix comprises a temperature from −100° C. to 50° C.
16. The system according to any of clauses 1 to 15, wherein the system comprises one or more sensors and the controller may be configured to control the mixer to vary the amounts of the first conditioning fluid and the second conditioning fluid and to adjust the mix of the first conditioning fluid and the second conditioning fluid in dependence on information from one or more sensors.
17. A method comprising projecting a patterned radiation beam to form an exposure area on a semiconductor substrate held on a substrate support within a lithographic apparatus, and using cooling apparatus to cool the semiconductor substrate, the cooling apparatus comprising a cooling element located above the substrate support and adjacent to the exposure area, the cooling element acting to remove heat from the semiconductor substrate, wherein the method further comprises:
   providing a first conditioning fluid having a first temperature and a second conditioning fluid having a second temperature to a mixer,
   controlling the mixer to control the ratio of the first conditioning fluid and the second conditioning fluid provided to the cooling apparatus.
18. The method according to clause 17, the method further comprising operating a first mass-flow controller to control a first mass-flow of the first conditioning fluid to the mixer, and operating a second mass-flow controller to control a second mass-flow of the second conditioning fluid to the mixer.
19. The method according to clause 18, wherein the first and second mass-flow controllers are operated to maintain a substantially constant mass-flow from the mixer to the cooling element.
20. The method according to any of clauses 17, 18 and 19, wherein the temperature of at least one of the first and the second conditioning fluids is altered by a controllable heater or a controllable cooler to control the temperature of the first and/or second conditioning fluids.

21. The method according to any of clauses 17 to 20, wherein the first and second conditioning fluids are mixed within the lithographic apparatus.

22. The method of clause 21 further comprises changing a thermal condition of the cooling apparatus from a set-point to a new set-point in less time than it takes for reticles to get changed and/or between consecutive wafers and/or in less or equal than thirty seconds by mixing the first and second conditioning fluids within the exposure chamber of the lithography apparatus.

23. A device manufactured using a lithographic apparatus comprising the apparatus of clauses 1 to 16 or according to the method of clauses 17 to 22.

The invention claimed is:

1. A system comprising a sub-system that is configured to change a thermal condition of a physical component from a set-point to a new set-point, wherein the sub-system comprises:
  a mixer configured to receive a first conditioning gaseous fluid having a first temperature and a second conditioning gaseous fluid having a second temperature different from the first temperature, and configured to supply, to the physical component, a mix of the first conditioning gaseous fluid and the second conditioning gaseous fluid; and
  a controller configured to control the mixer in dependence on the new set-point, and configured to control the mixer so as to maintain a magnitude of a mass flow-rate of the mix towards the physical component independent of the set-point and of the new set-point.

2. The system of claim 1, wherein the sub-system comprises:
  a first mass-flow controller configured to control a first mass-flow of the first conditioning gaseous fluid to the mixer; and
  a second mass-flow controller configured to control a second mass-flow of the second conditioning gaseous fluid to the mixer; and
  the controller is configured to control the first mass-flow controller and the second mass-flow controller in dependence on the new set-point.

3. The system of claim 1, wherein the sub-system comprises a controllable cooler configured to control a magnitude of the first temperature and/or a controllable heater configured to control a magnitude of the second temperature.

4. The system of claim 1, wherein:
  the system comprises a lithographic apparatus that is configured to use electromagnetic radiation for imaging a pattern via projection optics onto a semiconductor substrate held on a substrate support;
  the physical component is accommodated in the lithographic apparatus and comprises a cooling hood between the projection optics and the substrate support; and
  the cooling hood is configured to extract, from the semiconductor substrate, heat generated by the radiation incident on the semiconductor substrate.

5. The system of claim 4, wherein the mixer is accommodated within the lithographic apparatus, or wherein the mixer is located within the exposure chamber of the lithographic apparatus.

6. The system according to claim 4, wherein the lithographic apparatus comprises:
  a first inlet for receipt of the first conditioning gaseous fluid;
  a first conduit configured to channel the first conditioning gaseous fluid from the first inlet to the mixer;
  a second inlet for receipt of the second conditioning gaseous fluid; and
  a second conduit configured to channel the second conditioning gaseous fluid from the second inlet to the mixer.

7. The system according to claim 4, wherein the sub-system comprises:
  a controllable cooler configured to control a magnitude of the first temperature and accommodated external to the lithographic apparatus; and/or
  a controllable heater configured to control a magnitude of the second temperature and accommodated external to the lithographic apparatus.

8. The system according to claim 1, wherein the sub-system comprises a mixed conditioning fluid conduit configured to channel the mix of the first conditioning gaseous fluid and the second conditioning gaseous fluid from the mixer to the physical component, the mixer and the mixed conditioning fluid conduit configured to provide the mix to the physical component to control the thermal condition of the physical component within a predetermined time period.

9. The system of claim 8, wherein the predetermined time period is less than or equal to a time period required for altering a power of the physical component.

10. The system according to claim 8, where the mixed conditioning fluid conduit is embedded into the physical component.

11. The system according to claim 1, wherein the sub-system comprises a mixed conditioning fluid conduit configured to channel the mix of the first conditioning gaseous fluid and the second conditioning gaseous fluid from the mixer to the physical component, wherein the mixed conditioning fluid conduit is embedded into the physical component.

12. The system according to claim 1, wherein the mixer is able to receive and mix fluids at a temperature of $-100°$ C. or lower, or at a temperature from $-200°$ C. to $100°$ C.

13. The system according to claim 1, where the mix comprises a temperature from $-100°$ C. to $50°$ C.

14. The system according to claim 1, further comprising one or more sensors and the controller is configured to control the mixer to vary the amounts of the first conditioning gaseous fluid and the second conditioning gaseous fluid and to adjust the mix of the first conditioning gaseous fluid and the second conditioning gaseous fluid in dependence on information from the one or more sensors.

15. A method comprising:
  projecting a patterned radiation beam to form an exposure area on a semiconductor substrate held on a substrate support within a lithographic apparatus,
  using a cooling apparatus to cool the semiconductor substrate, the cooling apparatus comprising a cooling element located above the substrate support and adjacent to the exposure area, the cooling element acting to remove heat from the semiconductor substrate, and
  providing a first conditioning gaseous fluid having a first temperature and a second conditioning gaseous fluid having a second temperature different from the first temperature to a mixer, and
  controlling the mixer to control the ratio of the first conditioning gaseous fluid and the second conditioning gaseous fluid to provide a mix of the first and second conditioning gaseous fluids and maintaining a magnitude of a mass flow-rate of the mix towards the cooling element independent of the thermal condition of the cooling element.

16. The method according to claim 15, further comprising operating a first mass-flow controller to control a first mass-flow of the first conditioning gaseous fluid to the mixer, and operating a second mass-flow controller to control a second mass-flow of the second conditioning gaseous fluid to the mixer.

17. The method according to claim 16, wherein the first and second mass-flow controllers are operated to maintain a substantially constant mass-flow from the mixer to the cooling element.

18. The method according to claim 15, wherein the temperature of the first and/or second conditioning gaseous fluid is altered by a controllable heater or a controllable cooler to control the temperature of the first and/or second conditioning gaseous fluid.

19. The method according to claim 15, wherein the first and second conditioning gaseous fluids are mixed within the lithographic apparatus.

20. The method according to claim 15, wherein:
the controllable cooler is accommodated external to the lithographic apparatus; and/or
the controllable heater is accommodated external to the lithographic apparatus.

\* \* \* \* \*